United States Patent
Chun et al.

(10) Patent No.: US 7,952,271 B2
(45) Date of Patent: May 31, 2011

(54) ORGANIC LIGHT-EMITTING DEVICE (75) Inventors: Min-Seung Chun, Suwon-si (KR);
Dong-Hun Kim, Suwon-si (KR);
Mi-Kyung Kim, Suwon-si (KR);
Jung-Ha Son, Suwon-si (KR);
Jae-Hyun Kwak, Suwon-si (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 302 days.

(21) Appl. No.: 12/175,829

(22) Filed: Jul. 18, 2008

(65) Prior Publication Data
US 2009/0224655 A1  Sep. 10, 2009

(30) Foreign Application Priority Data
Mar. 4, 2008  (KR) ............... 10-2008-0020078

(51) Int. Cl.
*H01L 51/50* (2006.01)
*H01L 51/56* (2006.01)

(52) U.S. Cl. .............. 313/504; 445/24; 445/25
(58) Field of Classification Search .......... 313/504; 445/24–25; 428/690
See application file for complete search history.

(56) References Cited

U.S. PATENT DOCUMENTS

| | | | | |
|---|---|---|---|---|
| 4,946,754 A * | 8/1990 | Ong et al. | | 430/58.65 |
| 4,952,472 A * | 8/1990 | Baranyi et al. | | 430/58.8 |
| 5,858,564 A * | 1/1999 | Tamura et al. | | 428/690 |
| 6,617,051 B1 * | 9/2003 | Higashi et al. | | 428/690 |
| 7,439,669 B2 * | 10/2008 | Shinohara et al. | | 313/504 |
| 2005/0012445 A1 * | 1/2005 | Yamazaki et al. | | 313/500 |
| 2005/0127827 A1 * | 6/2005 | Hiraoka et al. | | 313/504 |
| 2005/0175858 A1 * | 8/2005 | Jung et al. | | 428/690 |
| 2005/0260445 A1 * | 11/2005 | Walters et al. | | 428/690 |
| 2007/0077449 A1 * | 4/2007 | Shinohara et al. | | 428/690 |
| 2008/0125608 A1 * | 5/2008 | Bender et al. | | 564/405 |
| 2009/0281311 A1 * | 11/2009 | Yamakawa et al. | | 544/180 |

FOREIGN PATENT DOCUMENTS

| | | |
|---|---|---|
| EP | 1 087 448 | 3/2001 |
| EP | 1087448 A2 * | 3/2001 |
| KR | 2003-76712 | 9/2003 |
| KR | 10-2004-0103394 | 12/2004 |
| KR | 10-2006-0089750 | 8/2006 |

OTHER PUBLICATIONS

Office Action issued by the Korean Intellectual Property Office on Apr. 28, 2009.
Registration Determination Certificate issued Sep. 30, 2009, in corresponding Korean Patent Application No. 2009-040777987.

* cited by examiner

*Primary Examiner* — Nimeshkumar D Patel
*Assistant Examiner* — Mary Ellen Bowman
(74) *Attorney, Agent, or Firm* — Robert E. Bushnell, Esq.

(57) ABSTRACT

An organic light-emitting device includes a substrate; a first electrode; a second electrode facing the first electrode; an organic layer disposed on the first electrode; and an emitting layer interposed between the organic layer and the second electrode. The concentration of inorganic impurities within the organic layer is 1000 ppb or less. The organic light-emitting device has high light-emitting efficiency, low driving voltage, high brightness, and long life span.

24 Claims, 3 Drawing Sheets

ORGANIC LIGHT-EMITTING DEVICE

CROSS-REFERENCE TO RELATED APPLICATION

This application claims the benefit of Korean Application No. 2008-20078, filed Mar. 4, 2008, in the Korean Intellectual Property Office, the disclosure of which is incorporated herein by reference.

BACKGROUND OF THE INVENTION

1. Field of the Invention

Aspects of the present invention relate to an organic light-emitting device, and more particularly, to an organic light-emitting device including an organic layer having a relatively low concentration of inorganic impurities.

2. Description of the Related Art

Organic light emitting diodes are self light-emitting devices having a wide viewing angle, excellent contrast, and a quick response time, and thus have received much attention. Moreover, organic light emitting diodes have excellent driving voltage and response speed characteristics, and can form multi-colored images.

Organic light emitting diodes conventionally have a stacked structure of anode/emitting layer/cathode. A hole injection layer, hole transport layer, and electron injection layer may be additionally stacked between the anode and the emitting layer or between the emitting layer and the cathode to form a structure such as anode/hole transport layer/emitting layer/cathode, and anode/emitting layer/electron transport layer/cathode. An example of an organic light-emitting diode is disclosed in Korean Patent Laid-Open Publication 2005-0040960.

However, conventional organic light-emitting diodes do not have satisfactory driving voltage, efficiency, and life span, and thus, improvements are desirable.

SUMMARY OF THE INVENTION

Aspects of the present invention provide an organic light-emitting device with improved life span, efficiency, and power consumption properties compared to devices of the prior art.

According to an embodiment of the present invention, there is provided an organic light-emitting device comprising: a substrate; a first electrode; a second electrode facing the first electrode; an organic layer disposed on the first electrode; and an emitting layer interposed between the organic layer and the second electrode; wherein the concentration of inorganic impurities within the organic layer is less than 1000 ppb.

According to an aspect of the present invention, the concentration of the inorganic impurities may be 10 ppb to 500 ppb.

According to an aspect of the present invention, the organic layer is a hole injecting layer or a hole transporting layer.

According to an embodiment of the present invention, there is provided a method of forming an organic layer of an organic light-emitting device, comprising forming an organic layer of a material that is purified by repetitive recrystallization process and/or repetitive sublimation process to have an inorganic impurity content of less than 1000 ppb.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Aspects of the present invention provide an organic light-emitting device comprising: a substrate; a first electrode; a second electrode facing the first electrode; an organic layer disposed on the first electrode; and an emitting layer (EML) interposed between the organic layer and the second electrode, wherein the concentration of inorganic impurities within the organic layer is less than 1000 ppb. More specifically, the concentration of the inorganic impurities may be 10 ppb to 500 ppb.

Generally, an organic layer included in an organic light-emitting device inevitably includes inorganic impurities due to the process of forming the organic layer, or other various causes. The organic light-emitting device according to aspects of the present invention reduces the concentration of inorganic impurities of the organic layer to a certain concentration or lower, thereby improving the interface effects between the first electrode and the organic layer, such that an organic light-emitting device with high efficiency, low voltage, high brightness and long life span can be obtained.

In a conventional organic light-emitting device, either a hole injecting layer (HIL) or a hole transporting layer (HTL) forms an interface with the first electrode, and the HIL or the HTL generally contains some inorganic impurities at a concentration in the order of ppm. According to aspects of the present invention, the concentration of the inorganic impurities of the organic layer contacting and forming the interface with the first electrode is reduced to a ppb level.

The organic layer contacting and forming an interface with the first electrode may be a HIL, or, in the case where a HIL is omitted, may be a HTL. Examples of materials for such organic layers may include an organic material including a tertiary amine, CN group, Si, or an aromatic ring, or may include a plurality of repeating groups.

The inorganic impurities may specifically be Ag, As, Be, Ca, Co, Cu, Hg, Li, Mn, Na, Pb, Sr, Pd, Sr, Vr, Zr, Al, Ba, Bi, Cd, Cr, Fe, K, Mg, Mo, Ni, Sn, Ti, Zn, or the like.

The organic layer may include a conventional hole injecting material. For example, the hole injecting material may include starburst-type amine derivatives disclosed in Advanced Material, 6, p. 677(1994), that is, TCTA, m-MT-DATA, m-MTDAPB, polyaniline/dodecylbenzenesulfonic acid (Pani/DBSA), which is a highly soluble conductive polymer, poly(3,4-ethylenedioxythiophene)/poly(4-styrenesulfonate) (PEDOT/PSS), polyaniline/camphor sulfonic acid (Pani/CSA), or polyaniline)/poly(4-styrenesulfonate (PANI/PSS), but the hole injecting material is not limited thereto.

Moreover, the organic layer may include a conventional hole transporting material. For example, the hole transporting material may include carbazole derivatives such as N-phenylcarbazole, polyvinyl carbazole, and conventional amine derivatives having aromatic condensed rings such as N,N'-bis (3-methylphenyl)-N,N'-diphenyl-[1,1-biphenyl]-4,4'-diamine (TPD), N,N'-di(naphthalene-1-yl)-N,N'-diphenyl benzidine (α-NPD), 4,4'-bis-[N-(1-naphthyl)-N-phenylamino] biphenyl (NPB), but the hole transporting material is not limited thereto.

The organic light-emitting device according to aspects of the present invention may have a wide variety of structures. Besides the organic layer, one or more layers selected from the group consisting of an HIL, HTL, electron blocking layer, hole blocking layer, electron transporting layer (ETL), and an electron injecting layer (EIL) may be included between the first electrode and the second electrode.

Figure 1A:
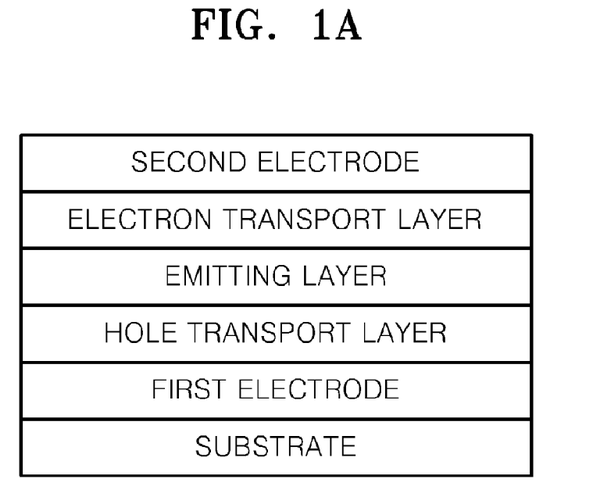
FIG. 1A to 1C are cross-sectional views illustrating schematic structures of organic light-emitting devices according to embodiments of the present invention.
Figure 1B:
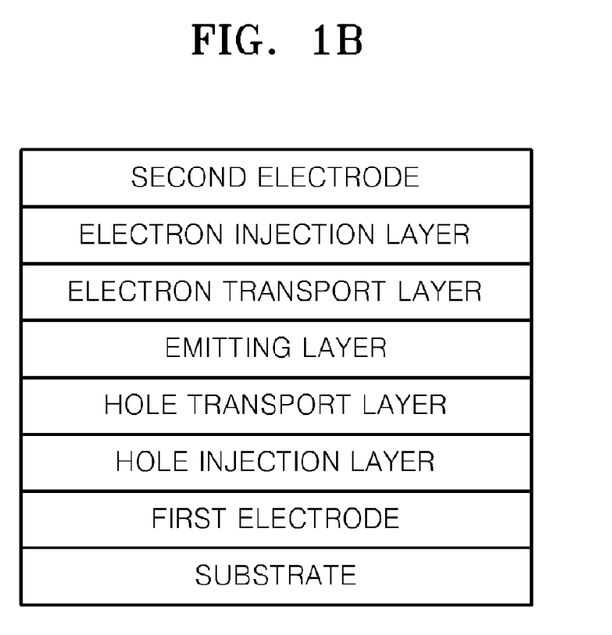
Figure 1C:
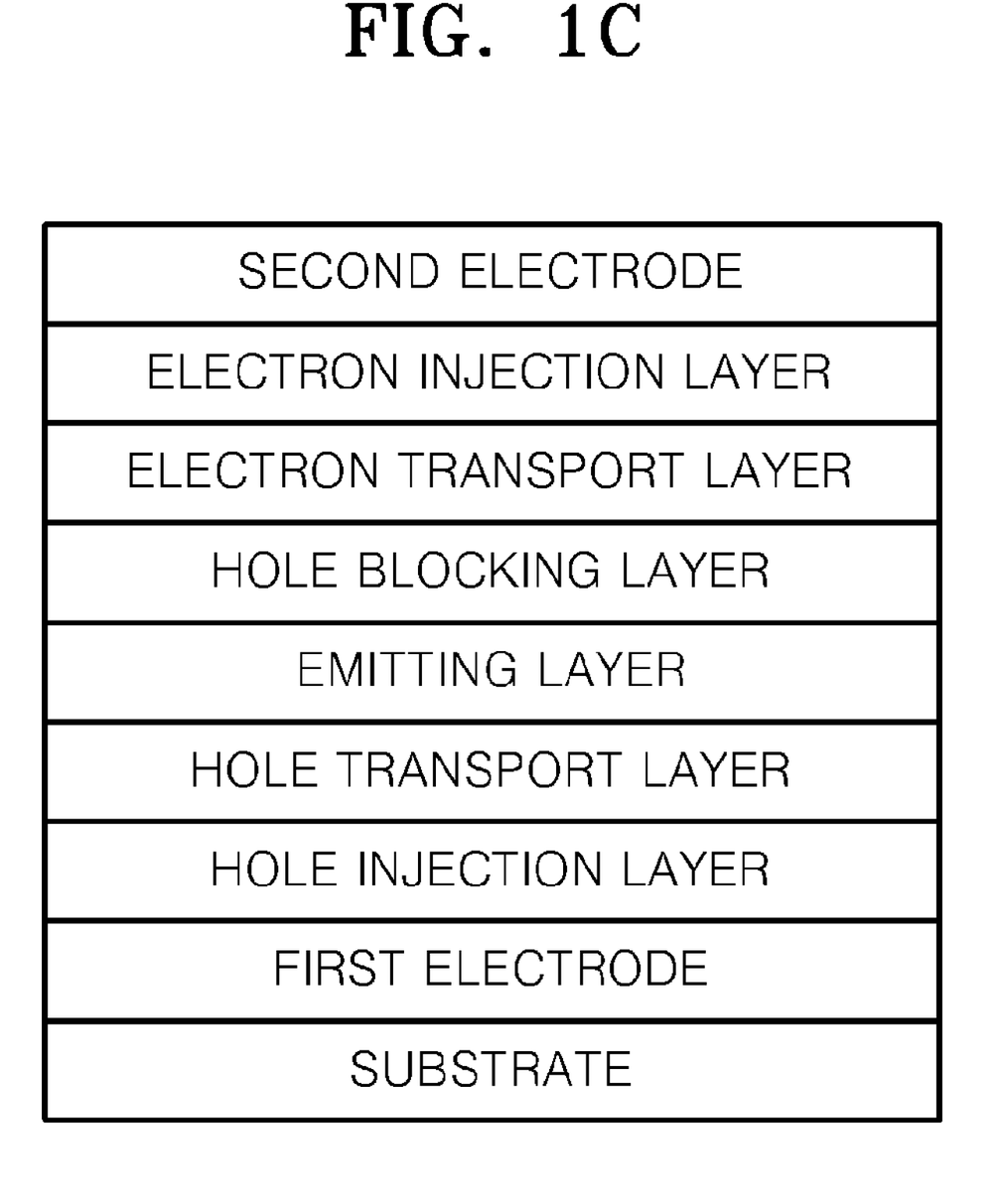

In more detail, various embodiments of the organic light-emitting device according to aspects of the present invention are illustrated in FIGS. 1A, 1B, and 1C. The organic light-emitting device of FIG. 1A has a structure of first electrode/ hole transport layer/emitting layer/electron transport layer/ second electrode. The organic light-emitting device of FIG. 1B has a structure of first electrode/hole injection layer/hole transport layer/emitting layer/electron transport layer/electron injection layer/second electrode. The organic light-emitting device of FIG. 1C has a structure of first electrode/hole injection layer/hole transport layer/emitting layer/hole blocking layer/electron transport layer/electron injection layer/second electrode.

As a non-limiting example, the organic light-emitting device according to aspects of the present invention may be a top-emission type organic light-emitting device. In a top-emission type organic light-emitting device, the substrate is formed of a reflective metal, and a first electrode formed of ITO, IZO or the like is formed thereon such that the thickness of the first electrode is less than that of the substrate. The first electrode tends to be more sensitive to the interface properties between the first electrode and the organic layer thereon. Therefore, the organic light-emitting device according to aspects of the present invention may demonstrate a more distinctive improvement compared to conventional devices in the case of the top-emission type organic light-emitting device.

The thickness of the first electrode of such a top-emission type organic light-emitting device may be 10 to 300 nm. More specifically, the thickness of the first electrode may be 10 to 150 nm.

The reflective metal of the substrate may be, for example, an Al or Ag-based metal.

The first electrode of the top-emission organic light-emitting device may be formed of a transparent conductive material such as ITO, IZO, $SnO_2$, or ZnO, or a metal may be mixed therewith. Examples of such metal include chrome, gold, platinum, nickel, copper, tungsten, silver, aluminum, or lanthanum, and alloys thereof.

The process of reducing the inorganic impurities from the organic layer in contact with the first electrode may be performed through a repetitive recrystallization process or a repetitive sublimation purification, depending on the physical properties of the organic material. When the recrystallization process is used, the solvent may be a reagent grade or similar solution that has a high purity and a low concentration of residual inorganic impurities, in order to prevent the inflow of inorganic impurities from the solution as much as possible. In the case of the sublimation purification, as a non-limiting example, a minimum of 3 or more purifications may be carried out. For example, a sublimation purifier used in the sublimation purification may be divided into three or more temperature zones, and sublimation purified materials may be extracted only in the middle temperature zone among the various temperature zones. The remaining organic materials from the other temperature zones other than the organic material extracted may preferably be sublimation purified at least a plurality of times again. Moreover, a synthesis process used to form the organic materials may minimize the use of metal catalysts during synthesis of the organic materials. If the use of metal catalysts is inevitable in the synthesis process, a Pd-based catalyst is recommended rather than a Cu-based catalyst.

Hereinafter, a method of manufacturing an organic light-emitting device according to aspects of the present invention will be described more fully, with reference to FIG. 1B. FIG. 1B is a cross-sectional view illustrating a schematic structure of an organic light-emitting device according to an embodiment of the present invention. The organic light-emitting device shown in FIG. 1B includes, in order, a substrate, first electrode, an HIL, an HTL, an EML, an ETL, an EIL, and a second electrode.

First, the first electrode is formed on the substrate. The substrate may be any substrate conventionally used in an organic light-emitting device. In consideration of transparency, surface planarity, convenience of handling, and water resistance, a variety of materials, such as, for example, glass or plastic, may be used to form the substrate. The first electrode may be modified in various ways to be a transparent electrode or a reflective electrode. As non-limiting examples, the first electrode may be formed of a highly conductive metal, such as Li, Mg, Al, Al—Li, Ca, Mg—In, Mg—Ag, Ca—Al, Al—ITO, ITO, or IZO.

Next, a hole injection layer (HIL) may be formed on the first electrode using a well-known method such as vacuum deposition, spin coating, casting, or Langmuir-Blodgett (LB) deposition.

If the HIL is formed by vacuum deposition, the deposition conditions may vary depending on the compound used as the material for the HIL, and the structure and thermal characteristics of the HIL to be formed. As non-limiting examples, the deposition temperature may be 100 to 500° C., the vacuum degree may be $10^{-8}$ to $10^{-3}$ torr, and the deposition rate may be 0.01 to 100 Å/sec.

If the HIL is formed by spin coating, the coating conditions may vary depending on the compound used as the material for the HIL and the structure and thermal characteristics of the HIL to be formed. As non-limiting examples, the spin coating rate may be 2000 to 5000 rpm, and a temperature of heat treatment for removing the solvent after coating may be 80 to 200° C.

The HIL may be formed of a conventional hole injecting material, and is not particularly limited. Specific examples of the hole injecting material include copper phthalocyanine (CuPc) or Starburst-type amines such as TCTA, m-MTDATA, IDE406 (Idemitsu Co.), pani/DBSA, and PEDOT/PSS, but are not limited thereto.

TCTA m-MTDATA

Pani/DBSA

PEDOT/PSS

The thickness of the HIL may be 20 to 200 nm, or, more specifically, 40 to 150 nm. If the thickness of the HIL is less than 20 nm, the hole injecting characteristics may be insufficient, and if the thickness of the HIL is greater than 200 nm, the driving voltage may be defective.

Next, a hole transport layer (HTL) may be formed on the HIL using a method such as vacuum deposition, spin coating, casting, or LB deposition. If the HTL is formed by vacuum deposition or spin coating, the deposition or coating conditions may vary depending on the compound used to form the HTL, but may generally be selected from the same range of conditions as for forming the HIL.

The HTL may be formed of a conventional hole transporting material, and is not particularly limited. Specific examples of the hole transporting material may include 1,3,5-tricarbazolyl benzene, 4,4'-biscarbazolyl biphenyl, polyvinyl carbazole, m-biscarbazolyl phenyl, 4,4'-biscarbazolyl-2,2'-dimethyl biphenyl, 4,4',4"-tri(N-carbazolyl) triphenylamine, 1,3,5-tri(2-carbazolylphenyl)benzene, 1,3,5-tris(2-carbazolyl-5-methoxyphenyl)benzene, bis(4-carbazolylphenyl)silane, N,N'-bis(3-methylphenyl)-N,N'-diphenyl-[1,1-biphenyl]-4,4'-diamine (TPD), N,N'-di(naphthalene-1-yl)-N,N'-diphenyl benzidine (α-NPD), N,N'-diphenyl-N,N'-bis(1-naphthyl)-(1,1'-biphenyl)-4,4'-diamine (NPB), poly(9,9-dioctylfluorene-co-N-(4-butylphenyl) diphenylamine (TFB) and poly(9,9-dioctylfluorene-co-bis-(4-butylphenyl-bis-N,N-phenyl-1,4-phenylenediamine (PFB), but are not limited thereto.

The thickness of the HTL may be 10 to 100 nm, or more specifically, 20 to 60 nm. If the thickness of the HTL is less than 10 nm, the hole transporting characteristics may be insufficient, and if the thickness of the HTL is greater than 100 nm, the driving voltage may be increased.

Next, an emitting layer (EML) may be formed on the HTL using a method such as vacuum deposition, spin coating, casting, or LB deposition. If the EML is formed by vacuum deposition or spin coating, the deposition or coating conditions may vary depending on the compound used to form the EML, but may generally be selected from the same range of conditions as for forming the HIL.

The EML may be formed of a conventional light-emitting material or a conventional host and dopant. As a dopant, both fluorescent and phosphorescent dopants well known to those of ordinary skill in the art may be used.

For example, Alq$_3$, 4,4'-N,N'-dicarbazole-biphenyl (CBP), poly-(n-vinylcarbazole) (PVK), distyrylarylene (DSA), GDI1403 (red phosphorescent host) of Gracel Co. or GGH01 (green fluorescent host) of Gracel Co. may be used as the host, but the host is not limited thereto.

For the dopant, IDE102, IDE105, and IDE118 available from Idemitsu Co. may be used as a fluorescent dopant, and Ir(ppy)$_3$ (ppy is an abbreviation for phenyl pyridine) (green), GD01 a green fluorescent dopant of Gracel Co., (4,6-F2ppy)$_2$Irpic (Reference: Chihaya Adachi etc. *Appl. Phys. Lett.*, 79, 2082-2084, 2001), TEB002, PtOEP(platinum(II) octaethylporphyrin) of Cobion Co., a compound represented by Formula 2 below (See Korean Patent No. 2005-0078472), Firpric, or Ir(piq)$_3$(tris(1-phenylisoquinoline) iridium (III)) may be used as a phosphorescent dopant, but the phosphorescent dopant is not limited thereto.

The amount of the dopant may be 0.1 to 20 parts by weight, and particularly, 0.5 to 15 parts by weight based on 100 parts by weight of the EML forming material (that is, the total weight of the host and the dopant is 100 parts by weight). If the amount of the dopant is less than 0.1 parts by weight, the effect of the addition of the dopant is insignificant, and if the amount of the dopant is greater than 20 parts by weight, density extinction such as density quenching may occur for both the fluorescence and phosphorescence, which is not desirable.

The thickness of the EML may be 10 to 100 nm, or more specifically, 10 to 60 nm. If the thickness of the EML is less than 10 nm, the emission characteristics may deteriorate, and if the thickness of the EML is greater than 100 nm, the driving voltage may be increased.

If the EML includes a phosphorescent dopant, a hole blocking layer (HBL) may be formed on the EML in order to prevent triplet excitons or holes from diffusing into the ETL. (Not shown in FIG. 1B). The hole blocking material that can be used is not particularly limited, and may be a conventional material used for hole blocking layers. For example, the hole blocking material may be an oxadiazole derivative, a triazole derivative, a phenanthroline derivative, or Balq or BCP, which are hole blocking materials disclosed in JP 11-329734 (A1).

Next, an electron transport layer (ETL) may be formed on the EML using a method such as vacuum deposition, spin coating, casting, or LB deposition. If the ETL is formed by vacuum deposition or spin coating, the deposition or coating conditions may vary depending on the compound used to form the ETL, but may generally be selected from the same range of conditions as for forming the HIL. The electron transporting material is not particularly limited, and may be, for example, Alq3.

The thickness of the ETL may be 10 to 40 nm, or more specifically, 25 to 35 nm. If the thickness of the ETL is less than 10 nm, the rate of electron transport may be excessive such that the charge balance may be disrupted, and if the thickness of the ETL is greater than 40 nm, the driving voltage may be increased.

Next, an electron injection layer (EIL) may be formed on the ETL using a method such as vacuum deposition, spin coating, casting, or LB deposition. If the EIL is formed by vacuum depositing or spin coating, the deposition or coating conditions may vary depending on the compound used to form the EIL, but may generally be selected from the same range of conditions as for forming the HIL.

The material for forming the EIL may include materials such as $BaF_2$, LiF, NaCl, CsF, $Li_2O$, BaO, and Liq (lithium quinolate), but is not limited thereto.

Liq

The thickness of the EIL may be 0.2 to 1 nm, or more specifically, 0.2 to 0.5 nm. If the thickness of the EIL is less than 0.2 nm, the EIL may not function effectively, and if the thickness of the EIL is greater than 1 nm, the driving voltage may be increased.

Next, a second electrode may be formed by depositing a second electrode material on the EIL, thereby completing the manufacture of the organic light-emitting device.

The second electrode material may be a transparent metal oxide with high conductivity such as ITO, IZO, $SnO_2$, or ZnO. Alternatively, the second electrode may be formed of a thin film of Li, Mg, Al, Al—Li, Ca, Mg—In, Mg—Ag, or Ca—Al, thereby forming a transparent electrode or reflective electrode. However, the second electrode is not limited to the metals or combinations thereof listed above.

The first electrode and the second electrode may function as an anode and a cathode respectively, but the reverse is also possible.

Thus far, the method of preparing the organic light-emitting device according to aspects of the present invention has been described with reference to FIG. 1B, but the structure of the organic light-emitting device is not limited to the structure shown in FIG. 1B.

The organic light-emitting device according to aspects of the present invention may be included in various forms of flat panel display devices, such as passive matrix organic light-emitting display devices and active matrix organic light-emitting display devices. In particular, if included in the active matrix organic light-emitting display device, the first electrode may be electrically connected to a source electrode or a drain electrode of a thin-film transistor included in the organic light-emitting display device.

Hereinafter, the aspects of the present invention will be described with reference to the examples below. However, these examples are for illustrative purposes only and are not intended to limit the scope of the invention.

EXAMPLE

An anode was prepared and used by cutting a Corning 15 $\Omega cm^2$ (1200 Å) Ag/ITO (Ag:ITO=100 nm:7 nm) glass substrate into a size of 50 mm×50 mm×0.7 mm, and sonicating for 5 minutes using isopropyl alcohol and deionized water. The anode was irradiated with UV light for 30 minutes and exposed to ozone to clean, and then was inserted into a vacuum depositing apparatus.

A hole injecting material by LUDIS Co. (commercial name: LHT-001) was then vacuum deposited on the anode to form a HIL having a thickness of 130 nm. Next, a hole transporting material by Hodokaya Co. (commercial name: EL-301) was vacuum deposited on the HIL to form a HTL having a thickness of 80 nm.

In order to provide a hole injection material having a reduced amount of impurities, the LHT-001 hole injecting material was synthesized using a Pd-based catalyst instead of a Cu-based catalyst, and the reagents used in the synthesis of the LHT-001 were all reagent grade reagents of 99% purity or higher, sold by Aldrich Co. Moreover, the process of purifying the synthesized materials included performing a conventional sublimation purification process three times followed by one round of sublimation purification and one round of recrystallization, and then another round of sublimation purification, to obtain the final material.

When sublimation purifying, unlike the conventional method of having three-stage temperature zones, five-stage temperature zones were set up and only the material from the middle temperature zone was taken, and the remaining materials from the other temperature zones were processed again with one round of sublimation purification, followed by one round of recrystallization and another round of sublimation purification.

In the material obtained as such, no inorganic impurities were detected under fluorescent X-ray detection, and 200 ppb of inorganic impurities were found through inductively coupled plasma mass spectroscopy (ICP-MS).

Next, GDI1403 by Gracel Co. as a conventional red phosphorescent host and Ir(piq)$_3$ as a conventional red phosphorescent dopant (the content of the dopant was 15 wt %) were co-deposited on the HTL to form a red phosphorescent EML having a thickness of 20 nm.

Next, Alq$_3$ was vacuum deposited on the EML to form an ETL having a thickness of 30 nm, LiF was vacuum deposited on the ETL to form an EIL having a thickness of 0.5 nm, and Mg/Ag (Mg:Ag=10:1) was vacuum-deposited on the EIL to a thickness of 16 nm to form a cathode, thereby completing the manufacture of an organic light-emitting device.

COMPARATIVE EXAMPLE

An organic light-emitting device was prepared using the same method as in the Example, except that the HIL of the organic light-emitting device was formed by vacuum depositing a hole injecting material having inorganic impurities with a concentration of 10 ppm or more detected by fluorescent X-ray detection.

EVALUATION EXAMPLE

Figure 2:
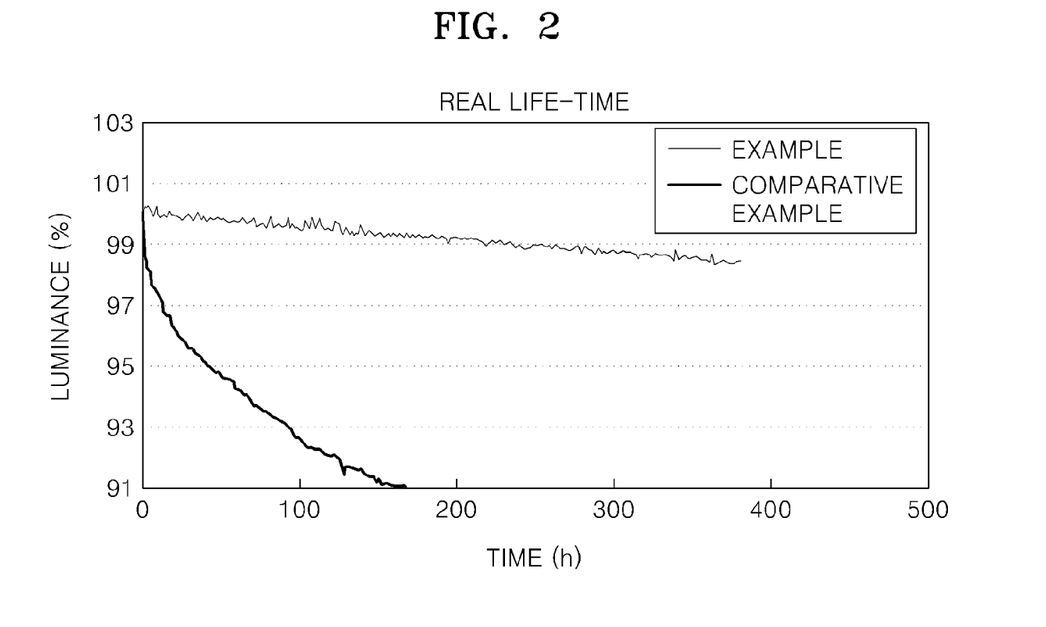
FIG. 2 is a graph illustrating accelerated life spans of an organic light emitting device according to the Example and of a conventional organic light-emitting device according to the Comparative Example.

The driving voltages, current densities, brightness, current efficiency, power, and color coordinates of the organic light-emitting devices prepared in the Example and the Comparative Example were evaluated using a PR650 (Spectroscan spectrometer, by PHOTO RESEARCH INC.), and the results are shown in Table 1 below. Moreover, the life span data of the organic light-emitting devices prepared in each of the Example and the Comparative Example is shown in FIG. 2, and the measured data of the driving voltage with respect to time during operation is shown in FIG. 3.

TABLE 1

|  | Driving voltage (V) | Current density (mA/cm$^2$) | Brightness (cd/m$^2$) | Current efficiency (cd/A) | Power (lm/W) | Color coordinates |
|---|---|---|---|---|---|---|
| Example | 4.0 | 7.3 | 424 | 5.8 | 4.6 | (0.123, 0.095) |
| Comparative Example | 4.1 | 7.2 | 395 | 5.5 | 4.2 | (0.125, 0.088) |

Figure 3:
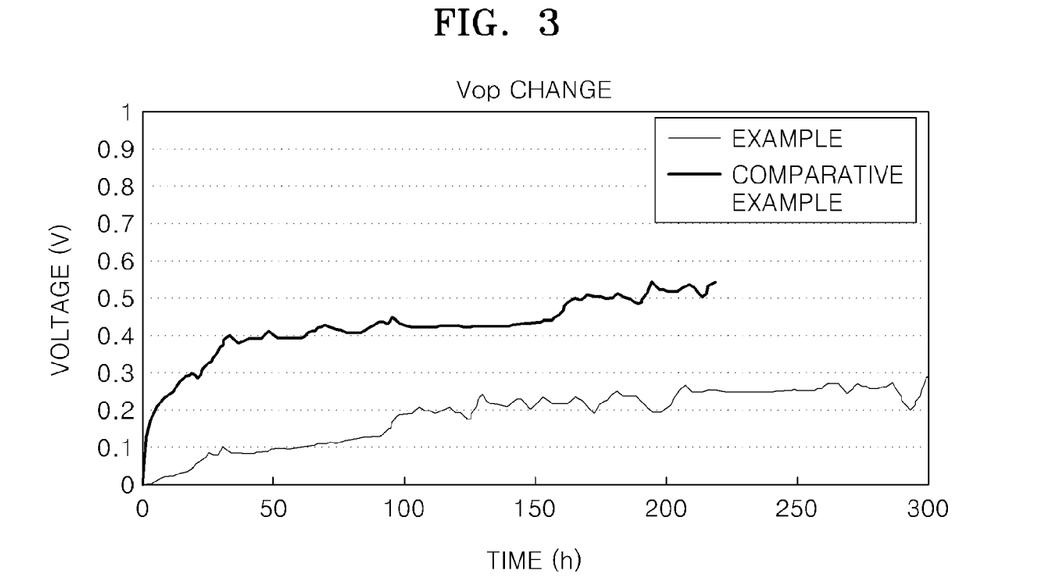
FIG. 3 is a graph illustrating the measured data of driving voltages with respect to time during operation of an organic light emitting device according to the Example and of a conventional organic light-emitting device according to the Comparative Example.

Referring to Table 1 and FIG. 3, the organic light-emitting device according to the present invention has superior driving voltage, current density, brightness, current efficiency, power, and color purity compared to the organic light-emitting device of the Comparative Example. Moreover, it can be seen from FIG. 2, that the organic light-emitting device according to the present invention has a superior life span compared to the Comparative Example.

The organic light-emitting device according to the present invention can obtain high efficiency, low voltage, high brightness, and long life span.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. An organic light-emitting device comprising:
    a substrate;
    a first electrode;
    a second electrode facing the first electrode;
    an organic layer disposed on the first electrode, wherein the organic layer is a hole injection layer comprising a hole injection material or a hole transport layer comprising a hole transport material; and
    an emitting layer interposed between the organic layer and the second electrode;
    wherein the concentration of inorganic impurities within the organic layer is 1000 ppb or less; and
    wherein the hole injection material or the hole transport material is purified by a repetitive sublimation process to have the inorganic impurity content of less than 1000 ppb, wherein the repetitive sublimation process is carried out in a sublimation purifier having three or more temperature zones, and the purified hole injecting material is extracted only from a middle temperature zone.

2. The organic light-emitting device of claim 1, wherein the concentration of the inorganic impurities is 10 ppb to 500 ppb.

3. The organic light-emitting device of claim 1, wherein the inorganic impurities comprise at least one selected from the group consisting of Ag, As, Be, Ca, Co, Cu, Hg, Li, Mn, Na, Pb, Sr, Pd, Sr, Vr, Zr, Al, Ba, Bi, Cd, Cr, Fe, K, Mg, Mo, Ni, Sn, Ti and Zn.

4. The organic light-emitting device of claim 1, wherein the organic layer comprises an organic material comprising at least one of a tertiary amine, a CN group, Si, and an aromatic ring.

5. The organic light-emitting device of claim 1, wherein the organic layer is the hole injection layer comprising the hole injecting material that is purified by a repetitive recrystallization process and the repetitive sublimation process to have the inorganic impurity content of less than 1000 ppb.

6. The organic light-emitting device of claim 5, wherein the hole injecting material is purified by repetitive recrystallization in a reagent grade solvent.

7. The organic light-emitting device of claim 5, wherein the hole injecting material is purified by the repetitive sublimation process including three or more purifications.

8. The organic light-emitting device of claim 1, wherein the organic layer is a hole transport layer comprising a hole transporting material that is purified by a repetitive recrystallization process and the repetitive sublimation process to have the inorganic impurity content of less than 1000 ppb.

9. The organic light-emitting device of claim 8, wherein the hole transporting material is purified by repetitive recrystallization in a reagent grade solvent.

10. The organic light-emitting device of claim 8, wherein the hole transporting material is purified by the repetitive sublimation process including three or more purifications.

11. The organic light-emitting device of claim 1, wherein the organic light-emitting device further comprises at least one layer selected from the group consisting of a hole injection layer, a hole transport layer, an electron blocking layer, a hole blocking layer, an electron transport layer, and an electron injection layer.

12. The organic light-emitting device of claim 11, wherein the organic light-emitting device has one of the following structures:
    first electrode/hole transport layer/emitting layer/electron transport layer/second electrode;
    first electrode/hole injection layer/hole transport layer/emitting layer/electron transport layer/electron injection layer/second electrode; and
    first electrode/hole injection layer/hole transport layer/emitting layer/hole blocking layer/electron transport layer/electron injection layer/second electrode.

13. The organic light-emitting device of claim 1, wherein the first electrode is an anode and the second electrode is a cathode.

14. The organic light-emitting device of claim 1, which is a top-emission organic light-emitting device, and wherein the substrate comprises a reflective metal.

15. The organic light-emitting device of claim 1, which is a top-emission organic light-emitting device, and wherein the first electrode comprises one of indium tin oxide (ITO), indium zinc oxide (IZO), tin oxide ($SnO_2$), zinc oxide (ZnO), and a mixture thereof.

16. The organic light-emitting device of claim 7, wherein the thickness of the first electrode is 10 nm to 300 nm.

17. A method of forming an organic layer of an organic light-emitting device, comprising forming the organic layer of a material that is purified by a repetitive sublimation process to have an inorganic impurity content of less than 1000 ppb, wherein the repetitive sublimation is carried out in a sublimation purifier having three or more temperature zones, and wherein the purified hole injecting material is extracted only from a middle temperature zone.

18. A method of forming an organic hole injecting layer of an organic light-emitting device, comprising forming the organic hole injecting layer of a hole injecting material that is purified by a repetitive sublimation process to have the inorganic impurity content of less than 1000 ppb, wherein the repetitive sublimation process is carried out in a sublimation purifier having three or more temperature zones, and the purified hole injecting material is extracted only from a middle temperature zone.

19. The method of claim 18, wherein the hole injecting material is purified by repetitive recrystallization in a reagent grade solvent and the repetitive sublimation process.

20. The method of claim 18, wherein the hole injecting material is purified by the repetitive sublimation process including three or more purifications.

21. A method of forming an organic hole transporting layer of an organic light-emitting diode, comprising forming the organic hole transporting layer of a hole transporting material that is purified by a repetitive sublimation process to have an inorganic impurity content of less than 1000 ppb, wherein the repetitive sublimation process is carried out in a sublimation purifier having three or more temperature zones, and the purified hole transporting material is extracted only from a middle temperature zone.

22. The method of claim 21, wherein the hole transporting material is purified by a repetitive recrystallization process in a reagent grade solvent and the repetitive sublimation process.

23. The method of claim 21, wherein the hole transporting material is purified by the repetitive sublimation process including three or more purifications.

24. The method of claim 17, wherein the material that forms the organic layer is synthesized by a catalytic process using a metal catalyst, wherein a Pd-based catalyst is selected as the metal catalyst and wherein a Cu-based catalyst is not used.

* * * * *